(12) United States Patent
Inoue

(10) Patent No.: US 10,869,375 B2
(45) Date of Patent: Dec. 15, 2020

(54) VEHICLE LIGHTING DEVICE

(71) Applicant: Mitsubishi Electric Corporation, Tokyo (JP)

(72) Inventor: Yu Inoue, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/615,591

(22) PCT Filed: Jun. 19, 2017

(86) PCT No.: PCT/JP2017/022518
§ 371 (c)(1),
(2) Date: Nov. 21, 2019

(87) PCT Pub. No.: WO2018/235127
PCT Pub. Date: Dec. 27, 2018

(65) Prior Publication Data
US 2020/0092969 A1 Mar. 19, 2020

(51) Int. Cl.
*H05B 45/50* (2020.01)
*F21S 43/14* (2018.01)
*F21S 41/141* (2018.01)
*H05B 47/23* (2020.01)

(52) U.S. Cl.
CPC ............ *H05B 45/50* (2020.01); *F21S 41/141* (2018.01); *F21S 43/14* (2018.01); *H05B 47/23* (2020.01)

(58) Field of Classification Search
None
See application file for complete search history.

(56) References Cited

U.S. PATENT DOCUMENTS

| | | | |
|---|---|---|---|
| 2012/0181931 A1 | 7/2012 | Katsura | |
| 2012/0206146 A1 | 8/2012 | Avenel | |
| 2013/0169159 A1* | 7/2013 | Lys | ........................ H05B 45/48 315/122 |
| 2018/0094799 A1* | 4/2018 | Shan | ................... H01L 25/0753 |

FOREIGN PATENT DOCUMENTS

| | | |
|---|---|---|
| DE | 102012107766 A1 | 2/2013 |
| JP | 2012-160436 A | 8/2012 |
| JP | 2014-519013 A | 8/2014 |

OTHER PUBLICATIONS

Office Action issued in corresponding German Application No. 11 2017 007 542.4 dated May 12, 2020.

* cited by examiner

*Primary Examiner* — Amy Cohen Johnson
*Assistant Examiner* — Jianzi Chen
(74) *Attorney, Agent, or Firm* — Birch, Stewart, Kolasch & Birch, LLP

(57) ABSTRACT

A bridge circuit (22) includes a first light-emitting element group (102, 110) and a second light-emitting element group (103, 120) connected in series; and a pair of comparison resistors (201, 202) connected in series and generating a voltage (Vref) equivalent to a voltage (VLED) at a connecting point between the first light-emitting element group (102, 110) and the second light-emitting element group (103, 120). A transistor (301, 302) is connected to a connecting point between the first light-emitting element group (102, 110) and the second light-emitting element group (103, 120) and a connecting point between the comparison resistors (201, 202), and operates when the first light-emitting element group (102, 110) or the second light-emitting element group (103, 120) is short-circuited.

13 Claims, 13 Drawing Sheets

VEHICLE LIGHTING DEVICE

TECHNICAL FIELD

The invention relates to a vehicle lighting device such as a headlight, a brake light, or a turn signal light.

BACKGROUND ART

Recently, for light sources used in various types of lamp fittings such as vehicle high-beam and low-beam headlights, etc., as an alternative to conventional tungsten filament bulbs and arc discharge lamps, semiconductor light-emitting elements such as Light Emitting Diodes (LEDs), Laser Diodes (LDs), and Organic Light Emitting Diodes (OLEDs) become widespread. The semiconductor light-emitting elements have long lifetimes, and can secure required brightness with small power and provide stable brightness by simple control of supplying a constant current. In addition, by disposing a plurality of semiconductor light-emitting elements to form a planar arrangement, a light source with a large area can be formed. Thus, the semiconductor light-emitting elements are suitable as light sources for vehicle lights.

It is to be noted that, for a vehicle light significant to safety, such as a headlight, a brake light, and a turn signal light, when the function of the light, i.e., visibility provided by the light such as brightness and luminous intensity distribution, is not sufficient, it is required to be notified to a driver.

In a headlight, a brake light, a turn signal light, or the like, that uses a plurality of LEDs connected in series, when a power supply path including LEDs is disconnected, all LEDs are turned off. Hence, it is easy for the driver to recognize the disconnection. On the other hand, when some of the plurality of LEDs are turned off due to a short circuit, it may appear that the light is performing light emission, and the driver may not be able to recognize the abnormality in brightness, luminous intensity distribution, and the like.

In addition, as the number of LEDs connected in series increases, the ratio of a drop voltage generated when a single LED is turned on to an output voltage generated when all LEDs are normally turned on decreases. Hence, even if some of the plurality of LEDs are short-circuited, the ratio of an output voltage at abnormal time to an output voltage at normal time is small, and thus, it is difficult for an LED turn-on device to determine a short circuit of an LED on the basis of a reduction in output voltage. Moreover, there are variations of voltage drop of individual LEDs and the variations further fluctuate in accordance with the temperature, and thus, in a light source having a large number of LEDs connected in series, individual variations and fluctuations are naturally added up, so that the added-up amount may become larger than the voltage drop of a single LED. In this case, it is further difficult to determine a short circuit of an LED on the basis of a reduction in output voltage.

Patent Literature 1 describes a short detecting circuit that detects a short-circuit failure occurring in a part of a plurality of LEDs connected in series. Specifically, the short detecting circuit detects a short-circuit failure of an LED by comparing a potential between a connecting point of one of a plurality of LEDs connected in series and a connecting point between a pair of resistors that generate a voltage equivalent to a voltage at the connecting point, with a threshold value.

CITATION LIST

Patent Literatures

Patent Literature 1: JP 2012-160436 A

SUMMARY OF INVENTION

Technical Problem

In Patent Literature 1, an Integrated Circuit (IC) that forms the short detecting circuit is disposed not on an LED side but on a power supply side. Reasons therefor are that an IC having such a high heat resistance temperature that the IC can be disposed near LEDs that get high temperature is expensive; a substrate on which LEDs that get high temperatures are mounted has a high unit cost per area due to enhanced thermal conductivity, and further, the substrate on which an IC having a complex circuit configuration is mounted has a large size and becomes expensive; a wiring line for power supply for operating an IC needs to be added; and the like.

When the short detecting circuit is disposed on the power supply side, there is required a wiring line for detecting a potential difference that connects a connecting point on the LED side to the short detecting circuit on the power supply side. Thus, there is a problem that when external noise enters the wiring line, erroneous detection by the short detecting circuit occurs.

In addition, there is another problem that, as described above, when the number of LEDs connected in series increases, it becomes more difficult to determine a short circuit of an LED on the basis of decrease in output voltage.

The invention is made to solve the above problems, and an object of the invention is to prevent erroneous detection of a short-circuit failure occurring in a part of a plurality of light-emitting elements connected in series.

Solution to Problem

A vehicle lighting device according to the invention includes: a light source unit including a plurality of light-emitting elements connected in series; and a power supply unit to turn on the plurality of light-emitting elements. In the light source unit, the plurality of light-emitting elements connected in series are divided into a first light-emitting element group and a second light-emitting element group. The light source unit includes: a pair of comparison resistors connected in series, the pair of comparison resistors being connected to a high potential side and a low potential side of the first light-emitting element group and the second light-emitting element group to generate a voltage equivalent to a voltage at a connecting point between the first light-emitting element group and the second light-emitting element group; and a transistor having a base connected to one of connecting points including: a connecting point between the first light-emitting element group and the second light-emitting element group; and a connecting point between the pair of comparison resistors, and having an emitter connected to another one of the connecting points. The first light-emitting element group, the second light-emitting element group, and the pair of comparison resistors form at least one bridge circuit. When one or more light-emitting elements included in the first light-emitting element group and the second light-emitting element group are short-circuited, the transistor operates.

Advantageous Effects of Invention

According to the present invention, the transistor connected to the connecting point between the first light-emitting element group and the second light-emitting element group and the connecting point between the pair of comparison resistors in the bridge circuit is configured to operate when one or more light-emitting elements included in the first light-emitting element group or the second light-emitting element group are short-circuited, and thus, without requiring a wiring line for detecting a potential difference which is conventionally required, it is possible to prevent erroneous detection of a short-circuit failure occurring in a part of the plurality of light-emitting elements connected in series.

In addition, by dividing the light-emitting elements connected in series into light-emitting element groups, in the detection target light emitting elements, the number thereof that are connected in series can be reduced, and thus, with avoiding influence of varied voltages and fluctuated voltages of the light-emitting elements, a short circuit can be securely detected.

DESCRIPTION OF EMBODIMENTS

To describe the invention in more detail, some embodiments for carrying out the invention will be described below with reference to the accompanying drawings.

First Embodiment

Figure 1:
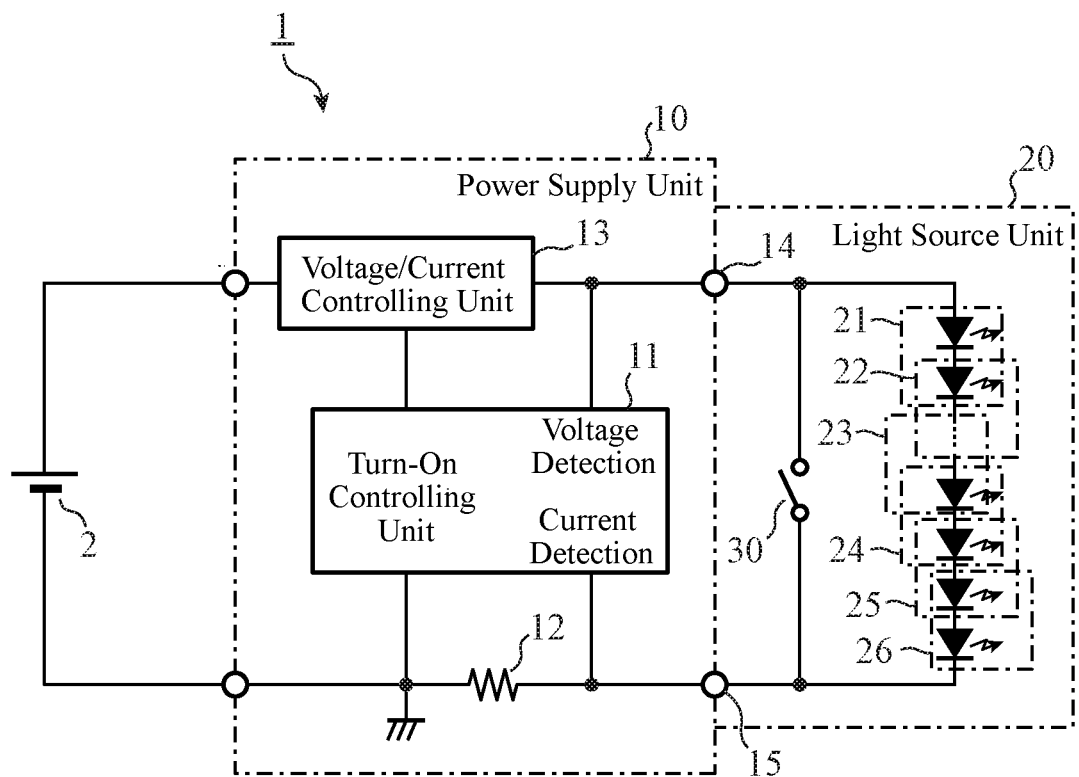
FIG. 1 is a circuit diagram showing an example of a configuration of a vehicle lighting device according to a first embodiment.

FIG. 1 is a circuit diagram showing an example of a configuration of a vehicle lighting device 1 according to a first embodiment. The vehicle lighting device 1 according to the first embodiment turns on a light source unit 20 by power supplied from a power supply 2 such as a vehicle battery. The vehicle lighting device 1 includes the light source unit 20 including a plurality of light-emitting elements connected in series; and a power supply unit 10 for turning on the light source unit 20. Here, LEDs are exemplified as the semiconductor light-emitting elements.

The light source unit 20 includes a plurality of LEDs connected in series between light-source-side power supply terminals 14 and 15 of the power supply unit 10; and a condition switching unit 30 connected between the light-source-side power supply terminals 14 and 15. The plurality of LEDs are divided into groups respectively forming bridge circuits 21 to 26 for detecting a short circuit. When a short-circuit failure occurs in one or more LEDs in the bridge circuits 21 to 26, the condition switching unit 30 switches the condition of the light source unit 20 and thereby notifies a driver and the power supply unit 10 of the short-circuit failure. For example, the condition switching unit 30 opens the connection between the light-source-side power supply terminals 14 and 15 during a normal period of the light source unit 20, and short-circuits between the light-source-side power supply terminals 14 and 15 or disconnects the light source unit 20 from the power supply unit 10 upon occurrence of a short-circuit failure of the light source unit 20.

The power supply unit 10 includes a turn-on controlling unit 11, a detection resistor 12, and a voltage/current controlling unit 13. The turn-on controlling unit 11 detects a voltage between the light-source-side power supply terminals 14 and 15. Since the detected voltage decreases by the short-circuiting between the light-source-side power supply terminals 14 and 15 performed by the condition switching unit 30 upon failure of the light source unit 20, the turn-on controlling unit 11 can recognize a short-circuit failure of the light source unit 20. When the turn-on controlling unit 11 recognizes a short-circuit failure of the light source unit 20, the turn-on controlling unit 11 notifies the vehicle side of the recognition result. In addition, since the light source unit 20 is turned off by the short-circuiting between the light-source-side power supply terminals 14 and 15 performed by the condition switching unit 30, the driver can recognize the short-circuit failure of the light source unit 20.

The turn-on controlling unit 11 detects a voltage between both ends of the detection resistor 12 which is connected between a low potential side of the power supply 2 and the light-source-side power supply terminal 15, and converts the voltage into a current value that flows through the light source unit 20. The turn-on controlling unit 11 controls the operation of the voltage/current controlling unit 13 using the current value obtained by the conversion.

The turn-on controlling unit 11 is formed of, for example, a microcomputer or a control IC.

The voltage/current controlling unit 13 is a DC/DC converter that generates and outputs a voltage and a current for turning on the LEDs, in accordance with control of the turn-on controlling unit 11.

Figure 2:
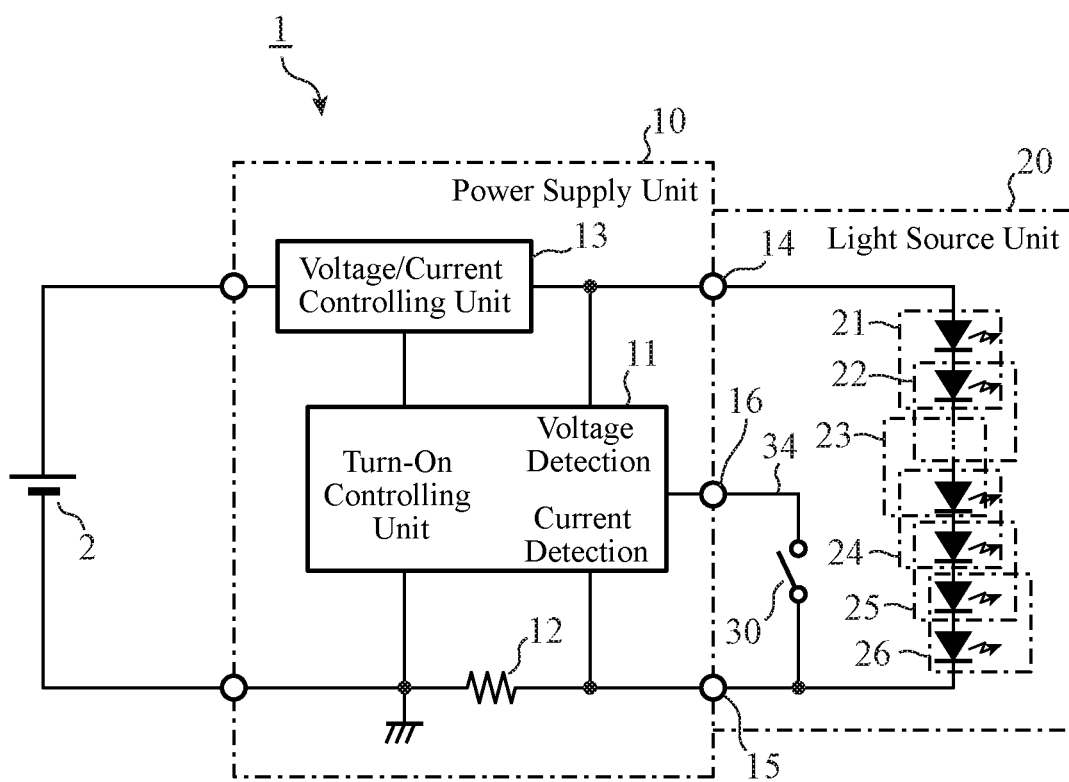
FIG. 2 is a circuit diagram showing another example of a configuration of the vehicle lighting device according to the first embodiment.

FIG. 2 is a circuit diagram showing another example of a configuration of the vehicle lighting device 1 according to the first embodiment. In the exemplary configuration of FIG. 2, the condition switching unit 30 is provided on a short-circuit informing signal line 34 that connects the light-source-side power supply terminal 15 to a signal terminal 16 of the power supply unit 10. The turn-on controlling unit 11 recognizes a short-circuit failure of the light source unit 20 by detecting whether a current can passes through the short-circuit informing signal line 34.

Next, an exemplary configuration of the bridge circuits 21 to 26 will be described. In the following, the bridge circuit 22 is described as a representative of the bridge circuits 21 to 26.

Figure 3:
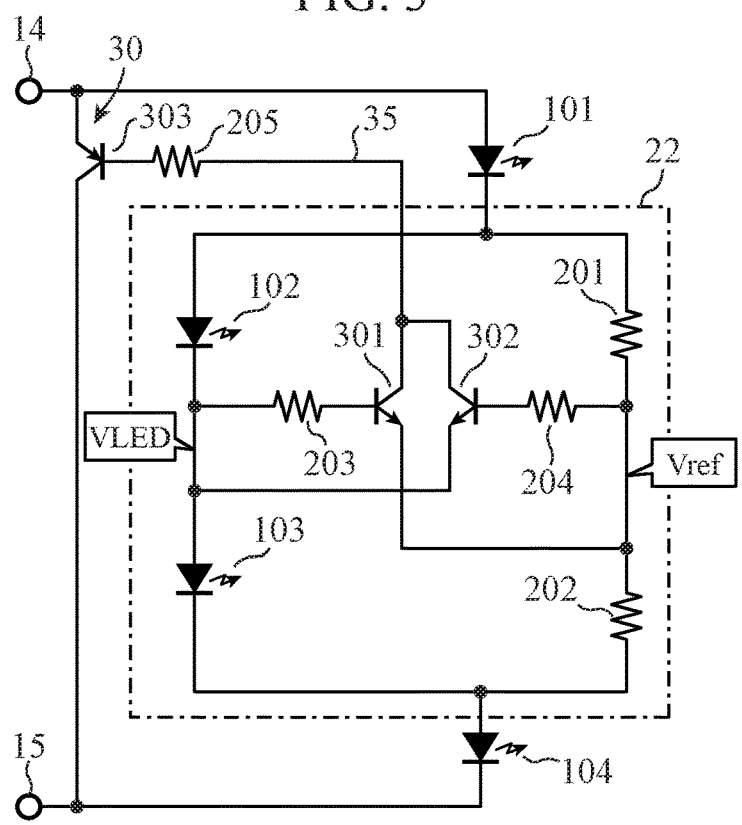
FIG. 3 is a circuit diagram showing an example of a configuration of a bridge circuit of the first embodiment, and shows an example of using npn transistors.

FIG. 3 is a circuit diagram showing an example of a configuration of the bridge circuit 22 of the first embodiment, and shows an example of using npn transistors 301 and 302. As shown in FIG. 3, the bridge circuit 22 includes LEDs 102 and 103 and comparison resistors 201 and 202. The LED 102 is a "first light-emitting element group" and the LED 103 is a "second light-emitting element group". The pair of comparison resistors 201 and 202 connected in series generates a voltage Vref equivalent to a voltage VLED at a connecting point between the LEDs 102 and 103, which form a pair, among a plurality of LEDs 101 to 104 connected in series. In this configuration, the ratio between the resistance value of the comparison resistor 201 and the resistance value of the comparison resistor 202 is 1:1. In addition, the bridge circuit 22 includes the transistors 301 and 302 for detecting a short-circuit failure of the LEDs 102 and 103. A base of the transistor 301 is connected to a connecting point between the LEDs 102 and 103 through a base resistor 203, and an emitter of the transistor 301 is connected to a connecting point between the comparison resistors 201 and 202. A base of the transistor 302 is connected to a connecting point between the comparison resistors 201 and 202 through a base resistor 204, and an emitter of the transistor 302 is connected to a connecting point between the LEDs 102 and 103. The condition switching unit 30 is a pnp transistor 303, and an emitter of the transistor 303 is connected to the light-source-side power supply terminal 14, a collector of the transistor 303 is connected to the light-source-side power supply terminal 15, and a base of the transistor 303 is connected to collectors of the transistors 301 and 302 through a base resistor 205.

Figure 4:
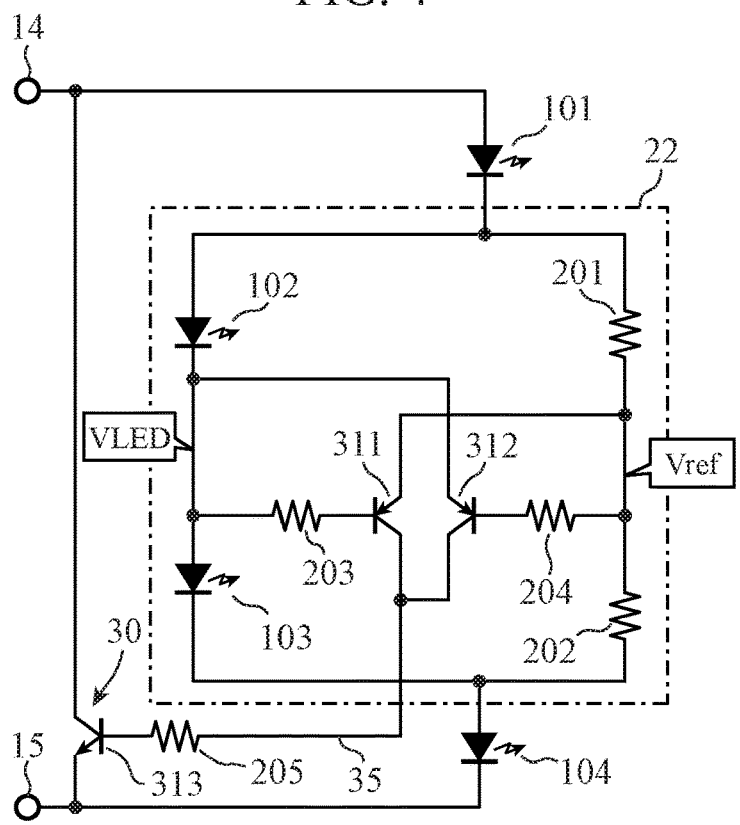
FIG. 4 is a circuit diagram showing another example of a configuration of the bridge circuit of the first embodiment, and shows an example of using pnp transistors.

FIG. 4 is a circuit diagram showing another example of a configuration of the bridge circuit 22 of the first embodiment, and shows an example of using pnp transistors 311 and 312. As shown in FIG. 4, the bridge circuit 22 may be configured to include the pnp transistors 311 and 312. A base of the transistor 311 is connected to a connecting point between the LEDs 102 and 103 through the base resistor 203, and an emitter of the transistor 311 is connected to a connecting point between the comparison resistors 201 and 202. A base of the transistor 312 is connected to a connecting point between the comparison resistors 201 and 202 through the base resistor 204, and an emitter of the transistor 312 is connected to a connecting point between the LEDs 102 and 103. In addition, the condition switching unit 30 is an npn transistor 313, and an emitter of the transistor 313 is connected to the light-source-side power supply terminal 15, a collector of the transistor 313 is connected to the light-source-side power supply terminal 14, and a base of the transistor 313 is connected to collectors of the transistors 311 and 312 through the base resistor 205.

The bridge circuit 21 is a so-called Wheatstone bridge.

Figure 5:
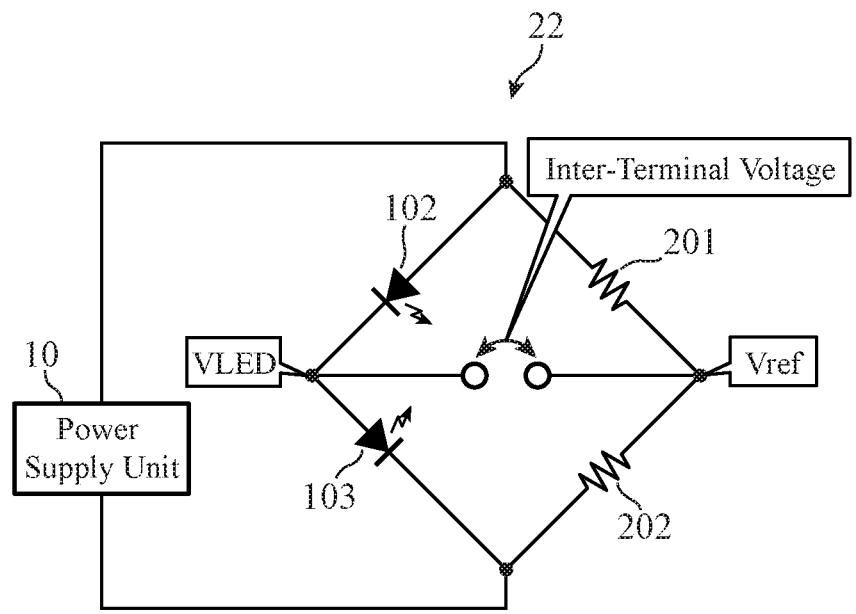
FIG. 5 is a diagram showing a Wheatstone bridge circuit equivalent to the bride circuit of the first embodiment.

FIG. 5 is a diagram showing a Wheatstone bridge circuit equivalent to the bridge circuit 21 of the first embodiment. The transistors 301 and 302 or the transistors 311 and 312 which are not shown compare the connecting point between the LEDs 102 and 103 and the connecting point between the comparison resistors 201 and 202 by their inter-terminal voltage. In FIG. 5, a single LED 102 is exemplified as the first light-emitting element group, and a single LED 103 is exemplified as the second light-emitting element group.

Next, a method of detecting a short-circuit failure in the bridge circuit 22 will be described.

Figure 6:
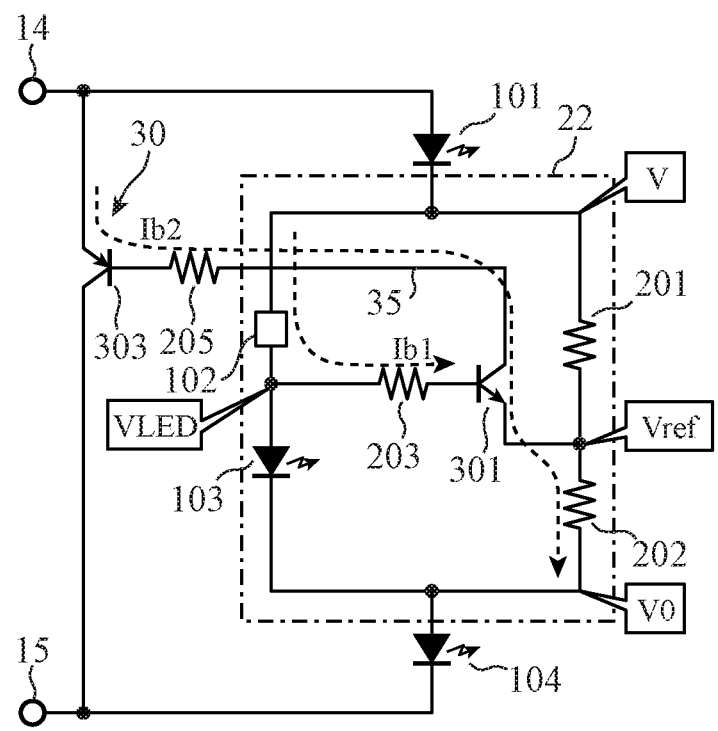
FIG. 6 is a diagram for describing operation performed when an LED 102 in the bridge circuit of FIG. 3 is short-circuited.
Figure 7:
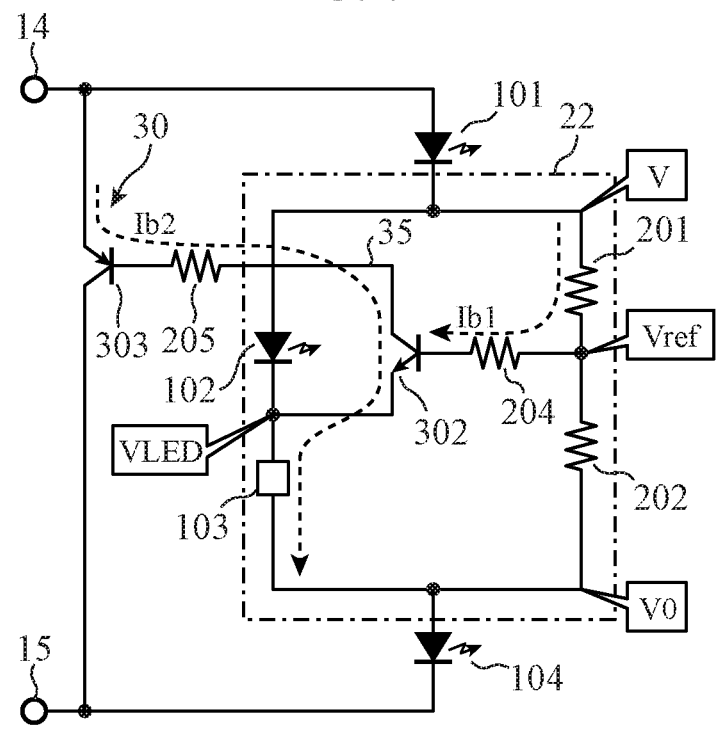
FIG. 7 is a diagram for describing operation performed when an LED 103 in the bridge circuit of FIG. 3 is short-circuited.

FIG. 6 is a diagram for describing operation performed when the LED 102 in the bridge circuit 22 of FIG. 3 is short-circuited. FIG. 7 is a diagram for describing operation performed when the LED 103 in the bridge circuit 22 of FIG. 3 is short-circuited. Note that for simplification of description, in FIG. 6 the transistor 302, etc., are not shown, and in FIG. 7 the transistor 301, etc., are not shown.

In FIG. 6, in the bridge circuit 22, the voltage on the high potential side is represented by "V", and the voltage on the low potential side is represented by "V0". The transistor 301 operates when the condition of equation (1) is satisfied. In equation (1), VBE is a base-emitter voltage of the transistor 301. The transistor 301 has a dead zone of the base-emitter voltage VBE up to "about 0.7 V".

At normal time, the voltage VLED at the connecting point between the LEDs 102 and 103 is "about (V+V0)/2" and the voltage Vref at the connecting point between the comparison resistors 201 and 202 is also "(V+V0)/2". Since the difference between the voltages VLED and Vref at the two connecting points is less than or equal to 0.7 V, base currents Ib1 and Ib2 do not flow and the transistors 301 and 303 do not operate. When the LED 102 is short-circuited, the voltage VLED becomes "V+V0", and thus, the base currents Ib1 and Ib2 flow and the transistors 301 and 303 operate.

$$VLED > (Vref + VBE) \qquad (1)$$

In FIG. 7, the transistor 302 operates when the condition of equation (2) is satisfied. In equation (2), VBE is a base-emitter voltage of the transistor 302. The transistor 302 has a dead zone of the base-emitter voltage VBE up to "about 0.7 V".

At normal time, the voltage VLED at the connecting point between the LEDs 102 and 103 and the voltage Vref at the connecting point between the comparison resistors 201 and 202 are "(V+V0)/2". Hence, base currents Ib1 and Ib2 do not flow and the transistors 302 and 303 do not operate. When the LED 103 is short-circuited, the voltage VLED becomes "V0", and thus, the base currents Ib1 and Ib2 flow and the transistors 302 and 303 operate.

$$VLED < (Vref - VBE) \qquad (2)$$

The collectors of the respective transistors 301 and 302 are connected to each other. Hence, when a short-circuit failure occurs in any one of the LEDs 102 and 103, a current passes through a short-circuit informing signal line 35.

In the case of the vehicle lighting device 1 shown in FIG. 1, when the LED 102 or the LED 103 is short-circuited, the transistor 303 which is the condition switching unit 30 operates, thereby short-circuiting between the light-source-side power supply terminals 14 and 15. In the case of the vehicle lighting device 1 shown in FIG. 2, when the LED 102 or the LED 103 is short-circuited, a base current Ib2 flowing through the short-circuit informing signal line 35 of FIG. 6, i.e., a collector current of the transistor 301, passes through the signal terminal 16 which is not shown in FIG. 6.

Assuming that the base-emitter voltage VBE generated when the transistor 301 operates is "0.7 V", if a drop voltage Vf generated when the LED 102 is turned on is greater than or equal to "1.4 V", then when the LED 102 is short-circuited, the transistor 301 operates, so that the short-circuit failure can be detected. Likewise, when the base-emitter voltage VBE generated when the transistor 302 operates is assumed to be "0.7 V", if a drop voltage Vf generated when the LED 103 is turned on is greater than or equal to "1.4 V", then when the LED 103 is short-circuited, the transistor 302 operates, so that the short-circuit failure can be detected. Namely, the drop voltage Vf generated when the LED is turned on is twice or more the base-emitter voltage VBE generated when the transistor operates.

When the semiconductor light-emitting elements are light-emitting diodes (LEDs), a drop voltage Vf generated when red, yellow, and green LEDs are turned on is approximately "2 V", and a drop voltage Vf generated when a blue LED is turned on is approximately "3 V". Note that by the term the blue LED, a white LED that converts blue light to yellow light using a phosphor may be indicated. Since the drop voltage Vf of each of the LEDs of the above-described colors is greater than or equal to "1.4 V", detection of a short-circuit failure by the transistors 301 and 302 is possible.

In addition, also when the semiconductor light-emitting elements are laser diodes (LDs), the drop voltage Vf is a high value about "5 V", and thus, detection of a short-circuit failure by the transistors 301 and 302 is possible.

In another case, in a case of Field Effect Transistors (FETs) that operate in the same manner as the transistors 301 and 302, a gate-source voltage VGS generated upon operation is about "3 V". Hence, when the transistors 301 and 302 in the bridge circuit 22 are replaced with FETs, if light-emitting elements whose drop voltage Vf generated when turned on is greater than or equal to "6 V" are used, detection of a short-circuit failure is possible.

In the above-described equations (1) and (2), a detection voltage at which a short circuit is detected, i.e., an apparent base-emitter voltage VBE, is adjustable.

Figure 8:
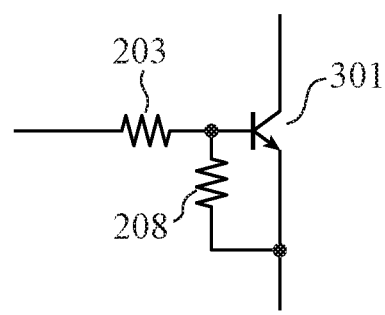
FIG. 8 is a diagram showing an example in which a detected voltage of a transistor 301 in the bridge circuit of FIG. 3 is adjusted.

Here, FIG. 8 shows an example of adjustment of a detection voltage of the transistor 301. By connecting a VBE adjusting resistor 208 between the base and emitter of the transistor 301, a detection voltage, i.e., an apparent base-emitter voltage VBE, is adjusted.

Likewise, by connecting a resistor between the base and emitter of the transistor 302, a detection voltage, i.e., an apparent base-emitter voltage VBE, is adjusted.

Note that the ratio between the number of LEDs included in the first light-emitting element group and the number of LEDs included in the second light-emitting element group of the bridge circuit 22 does not need to be 1:1, and can be any value.

Exemplary configurations of the bridge circuit 22 are shown below with reference to FIGS. 9A to 9H.

Figure 9A:
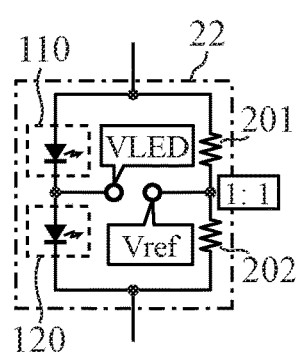
FIGS. 9A to 9H are diagrams showing exemplary configurations of a bridge circuit of the first embodiment.
Figure 9B:
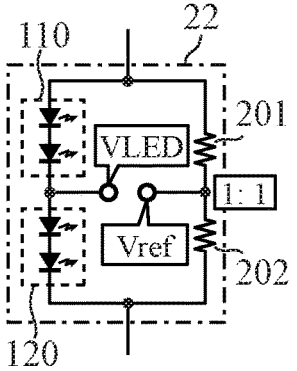
Figure 9C:
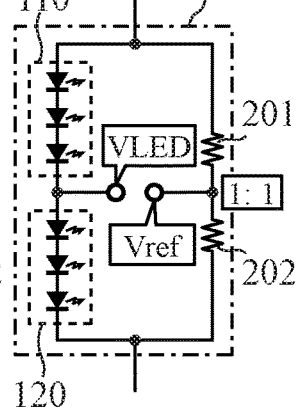
Figure 9D:
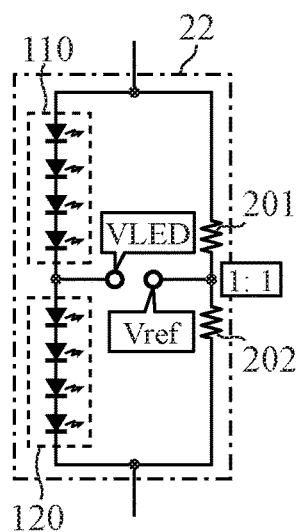

FIG. 9A is an example in which the first light-emitting element group 110 includes one LED, and the second light-emitting element group 120 includes one LED. FIG. 9B is an example in which the first light-emitting element group 110 includes two LEDs, and the second light-emitting element group 120 includes two LEDs. FIG. 9C is an example in which the first light-emitting element group 110 includes three LEDs, and the second light-emitting element group 120 includes three LEDs. FIG. 9D is an example in which the first light-emitting element group 110 includes four LEDs, and the second light-emitting element group 120 includes four LEDs. In all exemplary configurations of FIGS. 9A to 9D, the ratio between the number of LEDs in the first light-emitting element group 110 and the number of LEDs in the second light-emitting element group 120 is 1:1. In these exemplary configurations, the ratio between the resistance values of the corresponding comparison resistors 201 and 202 is also 1:1. In addition, when the drop voltage Vf per LED is "3 V", an inter-terminal voltage (VLED−Vref) generated when one of the LEDs included in the first light-emitting element group 110 is short-circuited is "1.5 V", and an inter-terminal voltage (Vref−VLED) generated when one of the LEDs included in the second light-emitting element group 120 is short-circuited is also "1.5 V".

Note that there is approximately a 10% variation of the drop voltage Vf of the LEDs, and the variation further fluctuates by about 10% by temperature. Therefore, if the number of LEDs connected in series increases, then individual variations and fluctuations are naturally added up, and the variation of the inter-terminal voltage also increases, and as a result, the degree of detection accuracy of a short-circuit failure by the transistors 301 and 302 decreases. Hence, the degree of detection accuracy increases as the number of LEDs connected in series decreases.

Note, however, that even when many LEDs are connected in series as in the exemplary configuration of FIG. 9D, if these LEDs are disposed in the same lamp fitting, then the temperatures of the LEDs are substantially uniform, and thus, there are no fluctuations of drop voltage Vf by temperature and there is no decrease in the degree of detection accuracy by the fluctuations.

In the exemplary configurations of FIGS. 9A to 9D, the number of LEDs in the first light-emitting element group 110 and the number of LEDs in the second light-emitting element group 120 are the same, but they may be different.

Figure 9E:
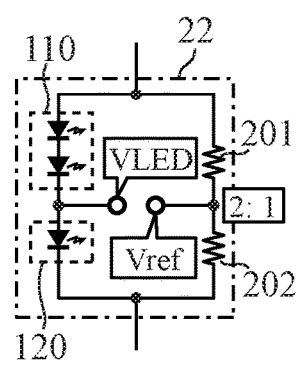

FIG. 9E shows an example in which the first light-emitting element group 110 includes two LEDs, and the second light-emitting element group 120 includes one LED. In the exemplary configuration of FIG. 9E, since the ratio between the number of LEDs in the first light-emitting element group 110 and the number of LEDs in the second light-emitting element group 120 is 2:1, the ratio between the resistance values of the corresponding comparison resistors 201 and 202 is also 2:1. In addition, when the drop voltage Vf per LED is "3 V", an inter-terminal voltage generated when one of the LEDs included in the first light-emitting element group 110 is short-circuited is "1.0 V", and an inter-terminal voltage generated when one LED included in the second light-emitting element group 120 is short-circuited is "2.0 V".

Figure 9F:
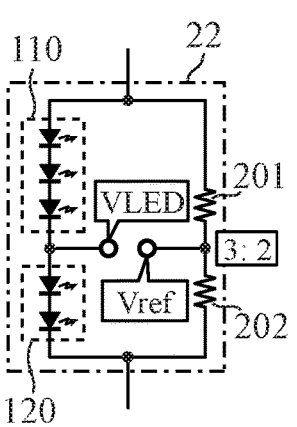

FIG. 9F is an example in which the first light-emitting element group 110 includes three LEDs, and the second light-emitting element group 120 includes two LEDs. In the exemplary configuration of FIG. 9F, since the ratio between the number of LEDs in the first light-emitting element group 110 and the number of LEDs in the second light-emitting element group 120 is 3:2, the ratio between the resistance values of the corresponding comparison resistors 201 and 202 is also 3:2. In addition, when the drop voltage Vf per LED is "3 V", an inter-terminal voltage generated when one of the LEDs included in the first light-emitting element group 110 is short-circuited is "1.2 V", and an inter-terminal voltage generated when one of the LEDs included in the second light-emitting element group 120 is short-circuited is "1.8 V".

Figure 9G:
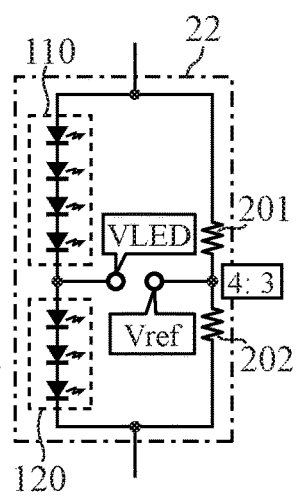

FIG. 9G is an example in which the first light-emitting element group 110 includes four LEDs, and the second light-emitting element group 120 includes three LEDs. In the exemplary configuration of FIG. 9G, since the ratio between the number of LEDs in the first light-emitting element group 110 and the number of LEDs in the second light-emitting element group 120 is 4:3, the ratio between the resistance values of the corresponding comparison resistors 201 and 202 is also 4:3. In addition, when the drop voltage Vf per LED is "3 V", an inter-terminal voltage generated when one of the LEDs included in the first light-emitting element group 110 is short-circuited is "1.3 V", and an inter-terminal voltage generated when one of the LEDs included in the second light-emitting element group 120 is short-circuited is "1.7 V".

Figure 9H:
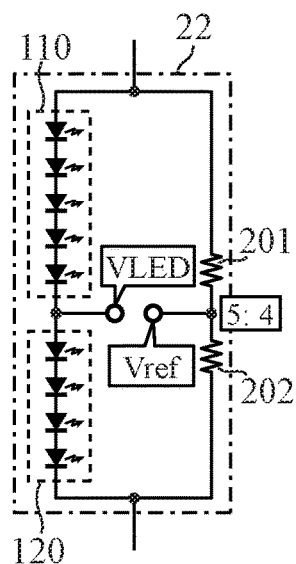

FIG. 9H is an example in which the first light-emitting element group 110 includes five LEDs, and the second light-emitting element group 120 includes four LEDs. In the exemplary configuration of FIG. 9H, since the ratio between the number of LEDs in the first light-emitting element group 110 and the number of LEDs in the second light-emitting element group 120 is 5:4, the ratio between the resistance values of the corresponding comparison resistors 201 and 202 is also 5:4. In addition, when the drop voltage Vf per LED is "3 V", an inter-terminal voltage generated when one of the LEDs included in the first light-emitting element group 110 is short-circuited is "1.3 V", and an inter-terminal voltage generated when one of the LEDs included in the second light-emitting element group 120 is short-circuited is "1.7 V".

As described above, the closer the number of LEDs included in the first light-emitting element group is to the number of LEDs included in the second light-emitting element group, the smaller the variation of the inter-terminal voltage is, and thus, the degree of detection accuracy of a short-circuit failure by the transistors 301 and 302 increases.

As described above, the vehicle lighting device 1 according to the first embodiment includes the light source unit 20 having a plurality of LEDs connected in series; and the power supply unit 10 that turns on the plurality of LEDs. The light source unit 20 includes a pair of comparison resistors 201 and 202 connected in series and generating a voltage Vref equivalent to a voltage VLED at a connecting point between the first light-emitting element group 110 and the second light-emitting element group 120 which are connected in series among the plurality of LEDs; the bridge circuit 21 including the first light-emitting element group 110, the second light-emitting element group 120, and the comparison resistors 201 and 202; and the transistors 301 and 302 each having a base connected via a resistor to either one of a connecting point between the first light-emitting element group 110 and the second light-emitting element group 120 and a connecting point between the pair of comparison resistors 201 and 202 in the bridge circuit 21, and having an emitter connected to the other one thereof, the transistors 301 and 302 operating when one or more LEDs included in the first light-emitting element group 110 and the second light-emitting element group 120 are short-circuited.

The transistors 301 and 302 that detect a short-circuit failure of an LED can be used at higher temperatures compared to an IC used in the conventional short detecting circuit, and thus can be disposed in the light source unit 20 that gets high temperatures. Since the bridge circuit 21 and the transistors 301 and 302 are provided in the light source unit 20, a short-circuit failure of an LED can be detected on a light source unit 20 side. Hence, it becomes unnecessary to provide a conventionally required wiring line for detecting a potential difference that connects a connecting point on an LED side to the short detecting circuit on a power supply side, and thus, external noise does not enter through the wiring line. In addition, the transistors 301 and 302 operate by current and have lower input impedance than an IC used in the conventional short detecting circuit. Hence, the transistors 301 and 302 are less likely to react to external noise. Therefore, the vehicle lighting device 1 can prevent erroneous detection of a short-circuit failure occurring in some of the plurality of LEDs connected in series.

In addition, since the sizes of the transistors 301 and 302 are smaller compared to those of the short detection ICs used in the conventional short detecting circuit, the substrate size of the light source unit 20 can be reduced, so that it is possible to implement a simple and low-cost vehicle lighting device 1.

In addition, in the first embodiment, the drop voltage Vf generated when one LED included in the first light-emitting element group 110 or the second light-emitting element group 120 is turned on is twice or more the base-emitter voltage VBE generated when the transistors 301 and 302 operate. When the base-emitter voltage VBE of the transistors 301 and 302 is "0.7 V", a short-circuit failure of a general LED in which the drop voltage Vf is twice or more the base-emitter voltage VBE can be detected.

In addition, the vehicle lighting device 1 according to the first embodiment includes the condition switching unit 30 that switches the load condition of the light source unit 20 with respect to the power supply unit 10 when the transistors 301 and 302 operate. By the condition switching unit 30 short-circuiting or cutting off the connection between the light-source-side power supply terminals 14 and 15, the light source unit 20 is turned off, and as a result, it is possible to visually notify the driver of an abnormality in the vehicle lighting device 1. In addition, by the condition switching unit 30 short-circuiting or cutting off the connection between the light-source-side power supply terminals 14 and 15, the power supply unit 10 can recognize an abnormality in voltage output, and it is possible for the power supply unit 10 to notify the vehicle side of an abnormality in the light source unit 20.

Note that, in FIG. 3, when both the LEDs 102 and 103 are short-circuited, the bridge circuit 22 cannot detect a short-circuit failure. However, the turn-on controlling unit 11 in the power supply unit 10 can securely recognize the occurrence of an abnormal situation in the light source unit 20, on the basis of a change in voltage between the light-source-side power supply terminals 14 and 15. In addition, when the turn-on controlling unit 11 recognizes an abnormality and stops power to be supplied to the light source unit 20, the light source unit 20 is turned off, and thus, the driver can also easily recognize an abnormal situation.

For example, when the output voltage of the power supply unit 10 is reduced to ⅔, i.e., when ⅓ of all LEDs included in the light source unit 20 are short-circuited, the turn-on controlling unit 11 in the power supply unit 10 recognizes the occurrence of an abnormal situation in the light source unit 20. By this, the turn-on controlling unit 11 can recognize an abnormal situation with sufficient time margin while also considering characteristics such as a variation of the drop voltage Vf of the LEDs when the light source unit 20 is turned on, and fluctuations of drop voltage Vf by temperature.

Second Embodiment

The condition switching unit 30 of the first embodiment is formed of a switch such as the transistor 303 that switches the load condition of the light source unit 20. In a configuration in which the transistor 303 switches opening and short-circuiting between the light-source-side power supply terminals 14 and 15, a voltage outputted from the power supply unit 10 changes in an analog manner, and thus, it is difficult for the turn-on controlling unit 11 in the power supply unit 10 to recognize a short-circuit failure. Hence, in a second embodiment, the condition switching unit 30 is configured such that a voltage outputted from the power supply unit 10 digitally changes to make it easier for the turn-on controlling unit 11 in the power supply unit 10 to recognize a short-circuit failure.

Figure 10:
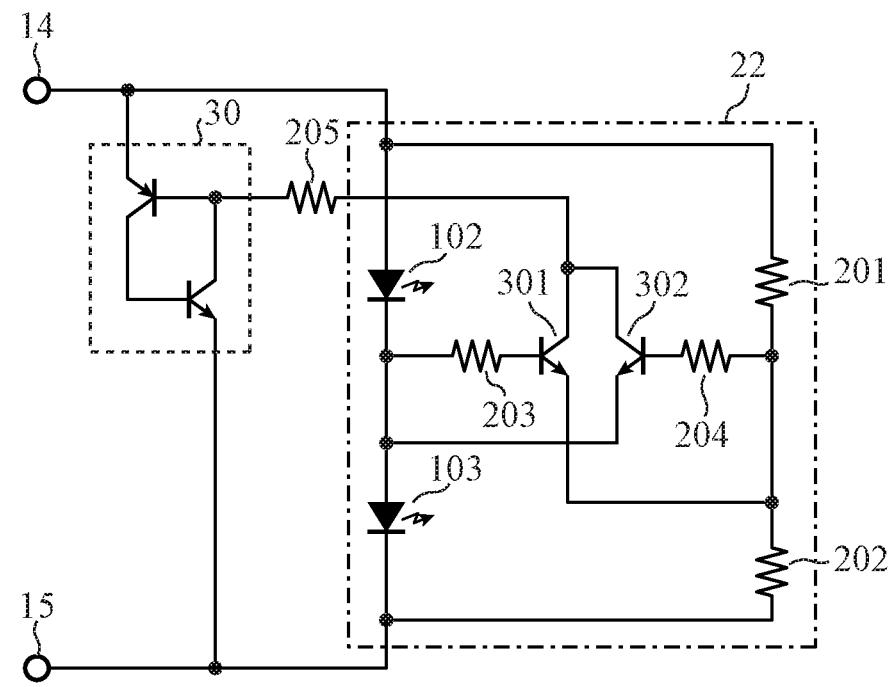
FIG. 10 is a circuit diagram showing an example of a configuration of a condition switching unit of a second embodiment.

FIG. 10 is a circuit diagram showing an example of a configuration of the condition switching unit 30 of the second embodiment. In FIG. 10, and in FIGS. 11 to 13 which will be described later, the same or corresponding portions as/to those of FIGS. 1 to 9 are denoted by the same reference signs and a description thereof is omitted.

The condition switching unit 30 shown in FIG. 10 is formed of a thyristor. Note that the thyristor may have a configuration including, as shown in FIG. 10, a combination of an npn transistor and a pnp transistor, or may be formed of a single element. In a period in which a short-circuit failure occurs in the LED 102 or the LED 103 and the transistor 301 or the transistor 302 are operating, the thyristor causes a short circuit between the light-source-side power supply terminals 14 and 15 and maintains this short-circuit condition by self-holding operation.

Figure 11:
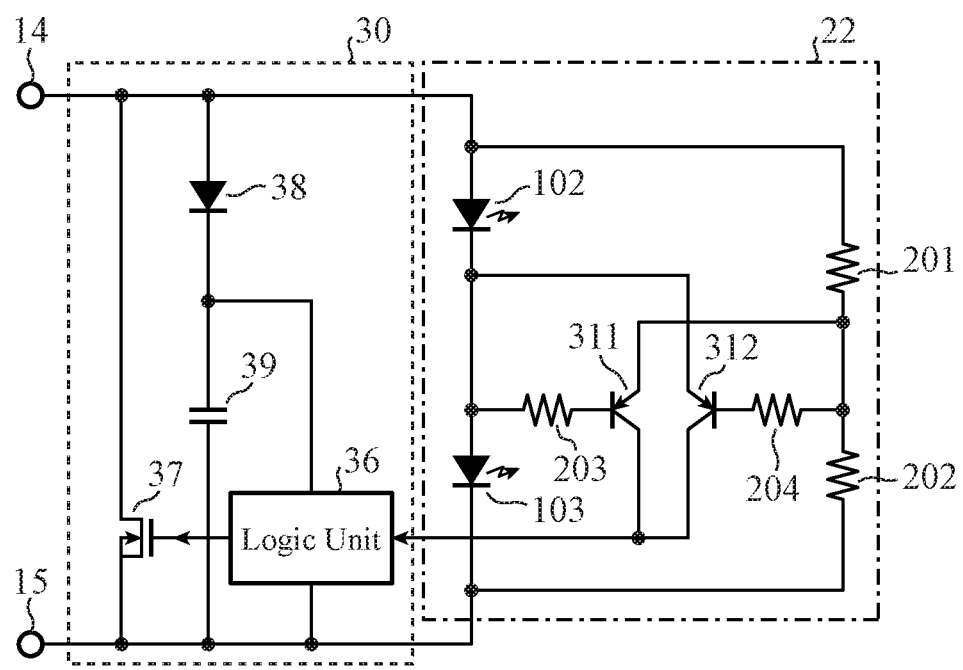
FIG. 11 is a circuit diagram showing another example of a configuration of the condition switching unit of the second embodiment.

FIG. 11 is a circuit diagram showing another example of a configuration of the condition switching unit 30 of the second embodiment. The condition switching unit 30 shown in FIG. 11 includes a logic unit 36, a switching element 37 such as a FET, a diode 38, and a capacitor 39. When the transistor 311 or the transistor 312 operates, the logic unit 36 controls the switching element 37 provided between the light-source-side power supply terminals 14 and 15, to cause a short circuit between the light-source-side power supply terminals 14 and 15 or repeatedly perform switching between short-circuiting and opening therebetween. The diode 38 and the capacitor 39 are connected in series between the light-source-side power supply terminals 14 and 15. The logic unit 36 is a logic circuit that processes digital signals, and operates using, as power, electric charge in the capacitor 39 which is charged through the diode 38 for preventing reverse current.

Figure 12:
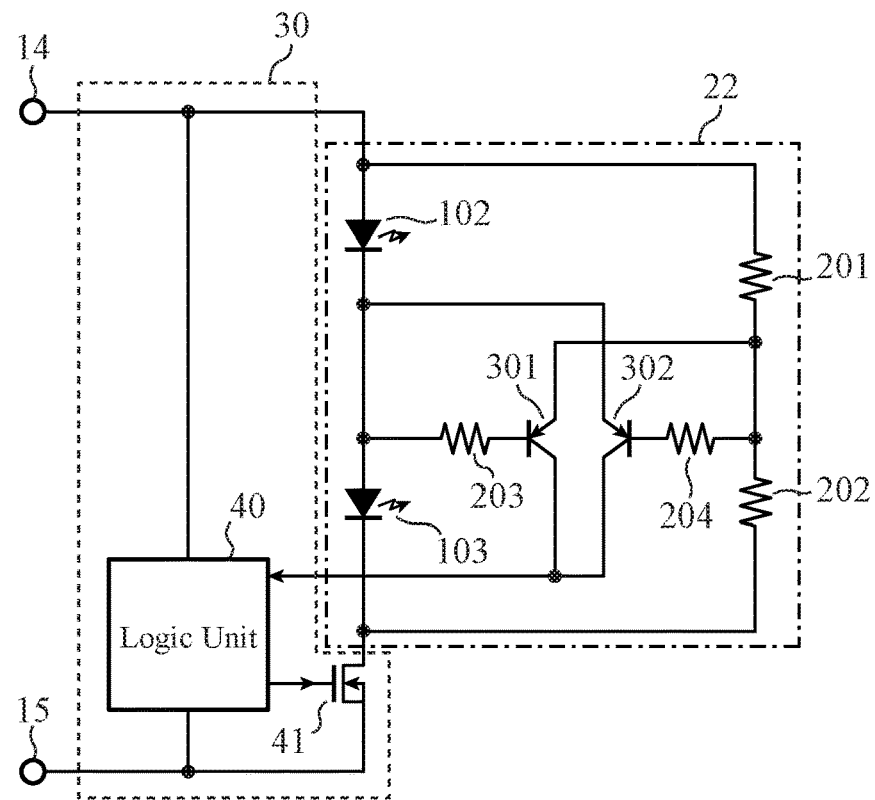
FIG. 12 is a circuit diagram showing another example of a configuration of the condition switching unit of the second embodiment.

FIG. 12 is a circuit diagram showing another example of a configuration of the condition switching unit 30 of the second embodiment. The condition switching unit 30 shown in FIG. 12 includes a logic unit 40 and a switching element 41 such as a FET. When the transistor 311 or the transistor 312 operates, the logic unit 40 controls the switching element 41 provided between the bridge circuit 22 and the light-source-side power supply terminal 15, to cut off the LEDs 102 and 103 from the power supply unit 10 or repeatedly perform switching between cutting off and connection therebetween. The logic unit 40 operates using an output from the power supply unit 10 as power.

Figure 13:
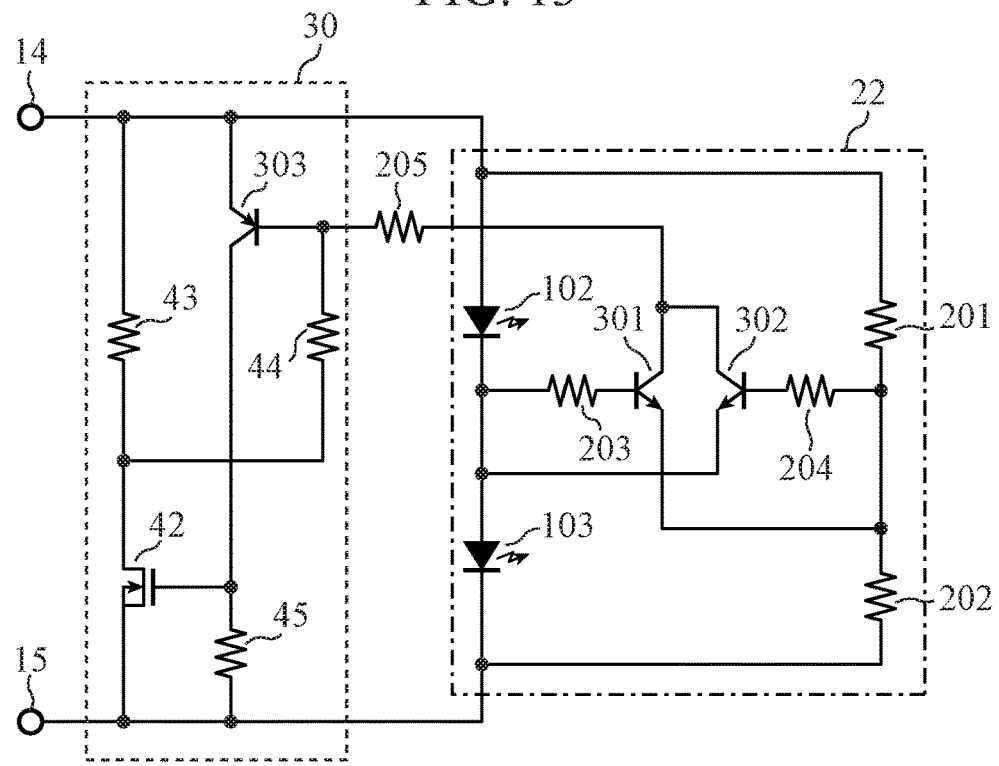
FIG. 13 is a circuit diagram showing another example of a configuration of the condition switching unit of the second embodiment.

FIG. 13 is a circuit diagram showing another example of a configuration of the condition switching unit 30 of the second embodiment. The condition switching unit 30 shown in FIG. 13 includes a transistor 303, a switching element 42 such as a FET, a current limiting resistor 43, a condition holding resistor 44, and a resistor for stabilizing a FET gate voltage 45, and performs self-holding operation like the thyristor shown in FIG. 10. The transistor 303 controls the switching element 42 which is provided on a current bypass line connecting the light-source-side power supply terminals 14 and 15, to cause a short circuit between the light-source-side power supply terminals 14 and 15, and maintains this short-circuit condition. In addition, in the exemplary configuration of FIG. 13, the current limiting resistor 43 that appropriately suppresses a current passing therethrough is provided on the current bypass line in the condition switching unit 30.

As described above, the vehicle lighting device 1 according to the second embodiment includes the condition switching unit 30 having a configuration shown in any of FIGS. 10 to 13. By the condition switching unit 30 short-circuiting both ends of the light source unit 20 or cutting off the light source unit 20 from the power supply unit 10, the light source unit 20 is turned off, so that it is possible to visually notify the driver of an abnormality in the vehicle lighting device 1. Alternatively, by the condition switching unit 30 repeatedly performing switching between a short-circuit condition or a cut-off condition and a normal condition between the light-source-side power supply terminals 14 and 15, the light source unit 20 blinks, so that it is possible to visually notify the driver of an abnormality in the vehicle lighting device 1.

In addition, by the condition switching unit 30 causing short-circuiting or cutting off the connection between the light-source-side power supply terminals 14 and 15, the power supply unit 10 can recognize an abnormality in voltage output, enabling the power supply unit 10 to notify the vehicle side of an abnormality in the light source unit 20. At this time, by forming the condition switching unit 30 of a thyristor, a logic unit, or the like, a voltage outputted from the power supply unit 10 digitally changes, and as a result, the turn-on controlling unit 11 in the power supply unit 10 can easily recognize a short-circuit failure.

Third Embodiment

A third embodiment shows a configuration in which the light source unit 20 includes a plurality of bridge circuits.

Figure 14:
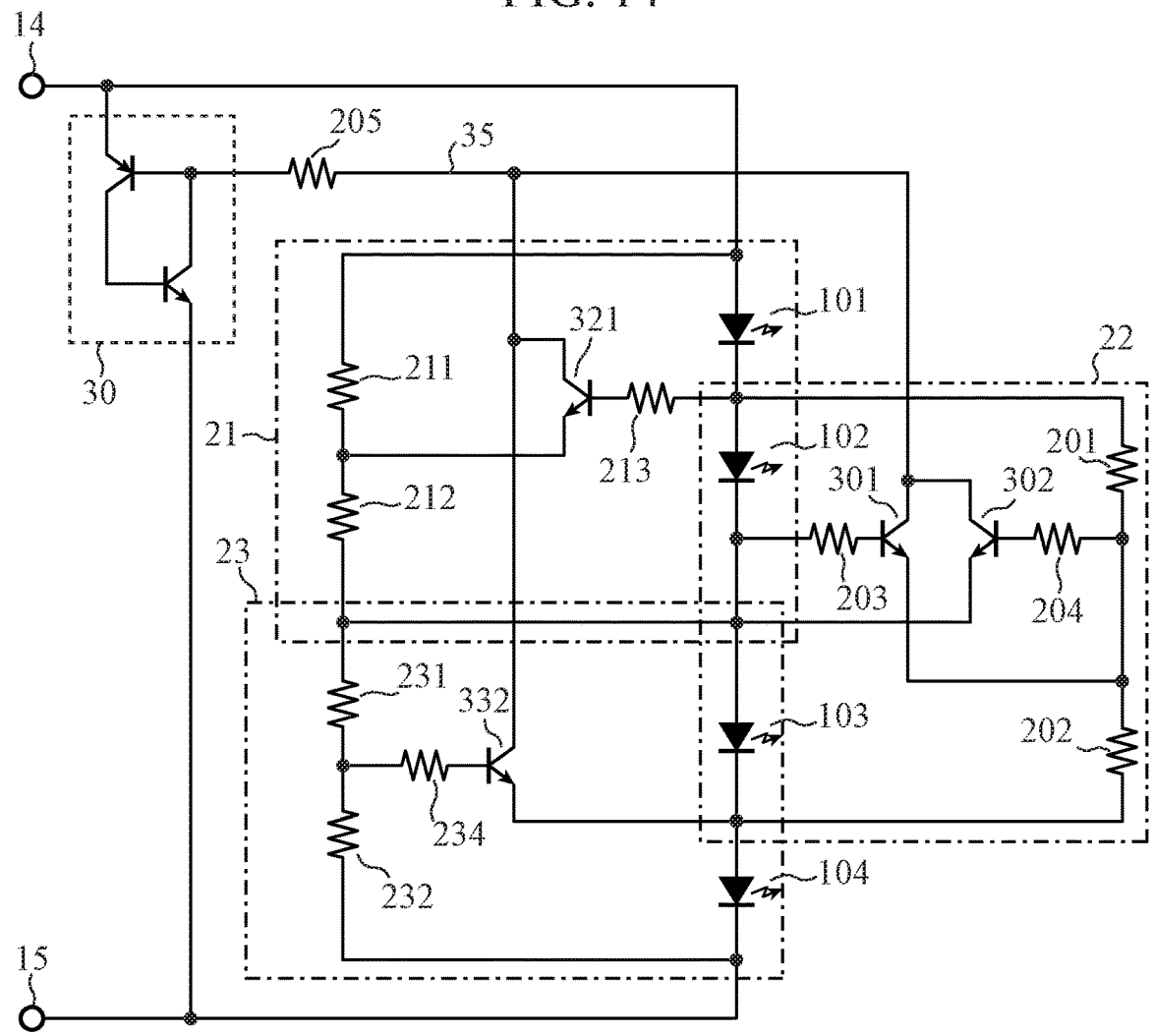
FIG. 14 is a diagram showing exemplary configurations of a plurality of bridge circuits of a third embodiment.
Figure 15:
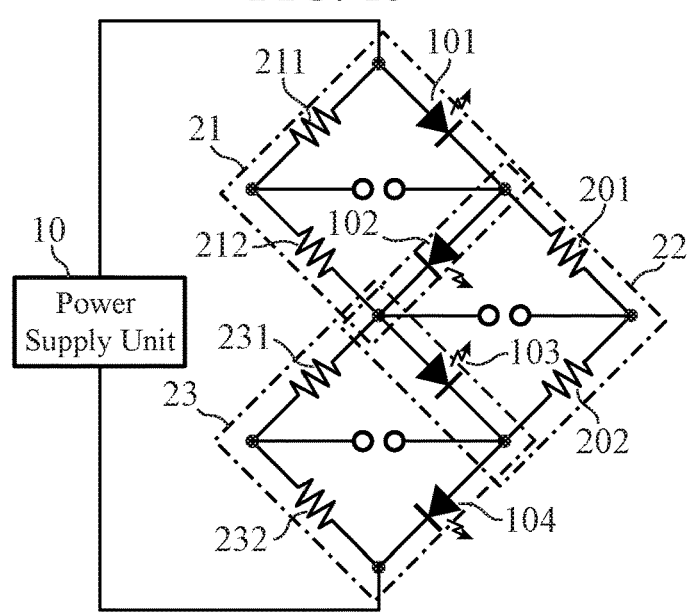
FIG. 15 is a diagram showing Wheatstone bridge circuits equivalent to the plurality of bridge circuits of the third embodiment.

FIG. 14 is a diagram showing exemplary configurations of a plurality of bridge circuits 21 to 23 of the third embodiment. FIG. 15 is a diagram showing Wheatstone bridge circuits equivalent to the plurality of bridge circuits 21 to 23 of the third embodiment. In FIGS. 14 and 15, and FIGS. 16 and 17 which will be described later, the same or corresponding portions as/to those of FIGS. 1 to 13 are denoted by the same reference signs and a description thereof is omitted.

As described in the first embodiment, since there is a variation of the drop voltage Vf of LEDs, the smaller the number of LEDs connected in series is, the higher the degree of detection accuracy of a short-circuit failure is. Hence, as shown in FIGS. 14 and 15, by grouping a circuit of a plurality of LEDs connected in series into a plurality of bridge circuits, the number of LEDs included in each bridge circuit is reduced.

As shown in FIG. 14, the LED 102 which is the second light-emitting element group of the bridge circuit 21 is also used as the first light-emitting element group of another bridge circuit 22. The LED 103 which is the second light-emitting element group of the bridge circuit 22 is also used as the first light-emitting element group of another bridge circuit 23.

Specifically, the bridge circuit 22 includes the LEDs 102 and 103 connected in series; and the comparison resistors 201 and 202 connected in series. In addition, the bridge circuit 21 includes a transistor 321 for detecting a short-circuit failure of the LED 101; and a base resistor 213. A short-circuit failure of the LED 102 is detected by the transistor 301 in the bridge circuit 22.

The bridge circuit 23 includes the LEDs 103 and 104 connected in series; and comparison resistors 231 and 232 connected in series. In addition, the bridge circuit 23 includes a transistor 332 for detecting a short-circuit failure of the LED 104; and a base resistor 234. A short-circuit failure of the LED 103 is detected by the transistor 302 in the bridge circuit 21.

Note that when short-circuit failures occur in both of the LEDs 102 and 103 in the bridge circuit 22, by disposing the bridge circuits as shown in FIG. 15, the short-circuit failures are detected by the bridge circuits 21 and 23.

In addition, collectors of the respective transistors 301, 302, 321, and 331 included in the bridge circuits 21 to 23 are connected to the short-circuit informing signal line 35.

Figure 16:
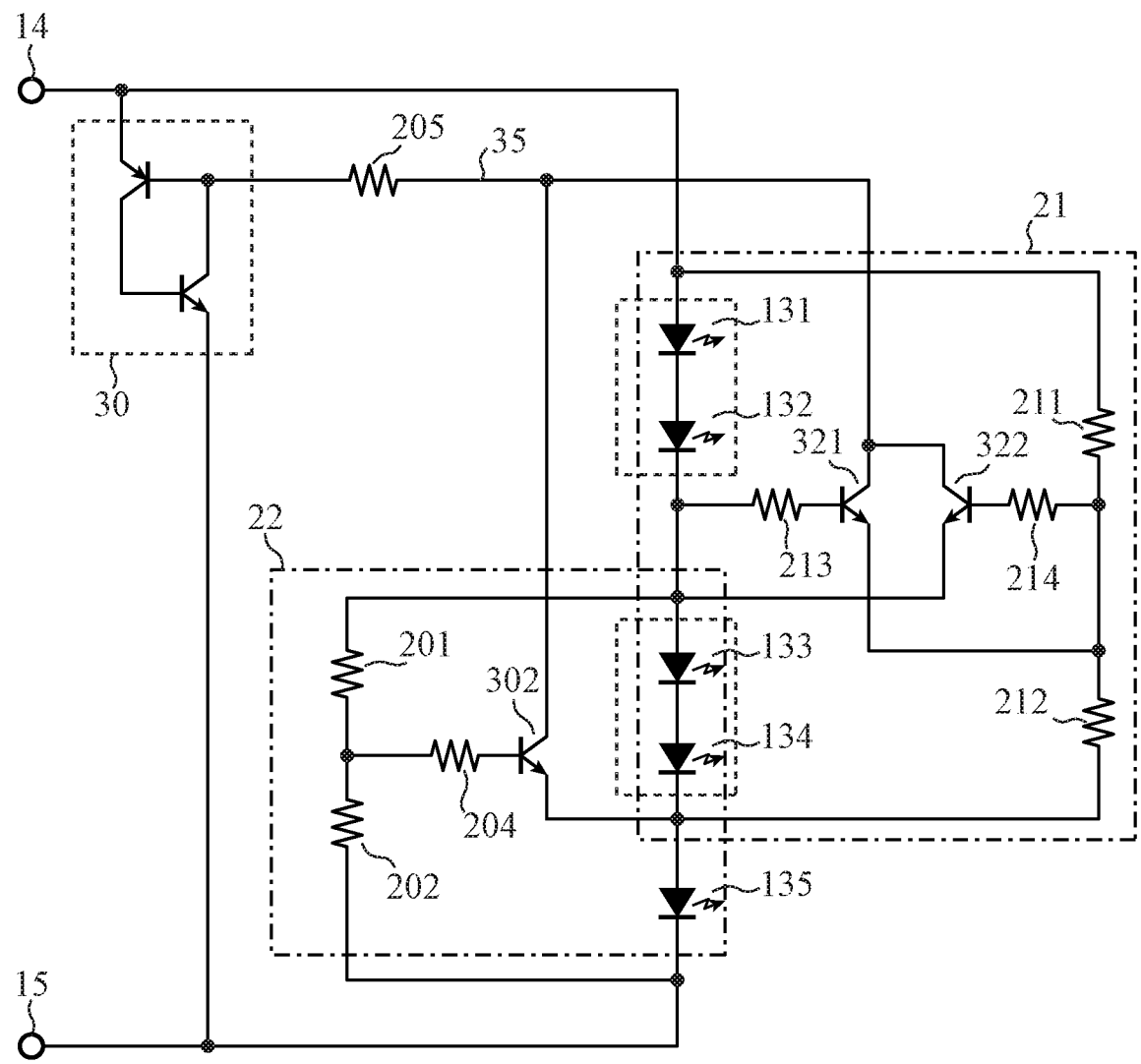
FIG. 16 is a diagram showing exemplary configurations of a plurality of bridge circuits of the third embodiment.

FIG. 16 is a diagram showing exemplary configurations of the plurality of bridge circuits 21 and 22 of the third embodiment. As shown in FIG. 16, LEDs 131 and 132 form the first light-emitting element group of the bridge circuit 21. LEDs 133 and 134 form the second light-emitting element group of the bridge circuit 21. In addition, the LEDs 133 and 134 are also used as the first light-emitting element group of the bridge circuit 22. An LED 135 forms the second light-emitting element group of the bridge circuit 22.

The number of LEDs included in the first light-emitting element group may differ from the number of LEDs included in the second light-emitting element group like the bridge circuit 22.

Note that, the LED 131 and the LED 132 are implemented by, for example, an LED module in which a plurality of LED chips are mounted in a single package. Likewise, the LEDs 133 and 134 are also implemented by an LED module.

Figure 17:
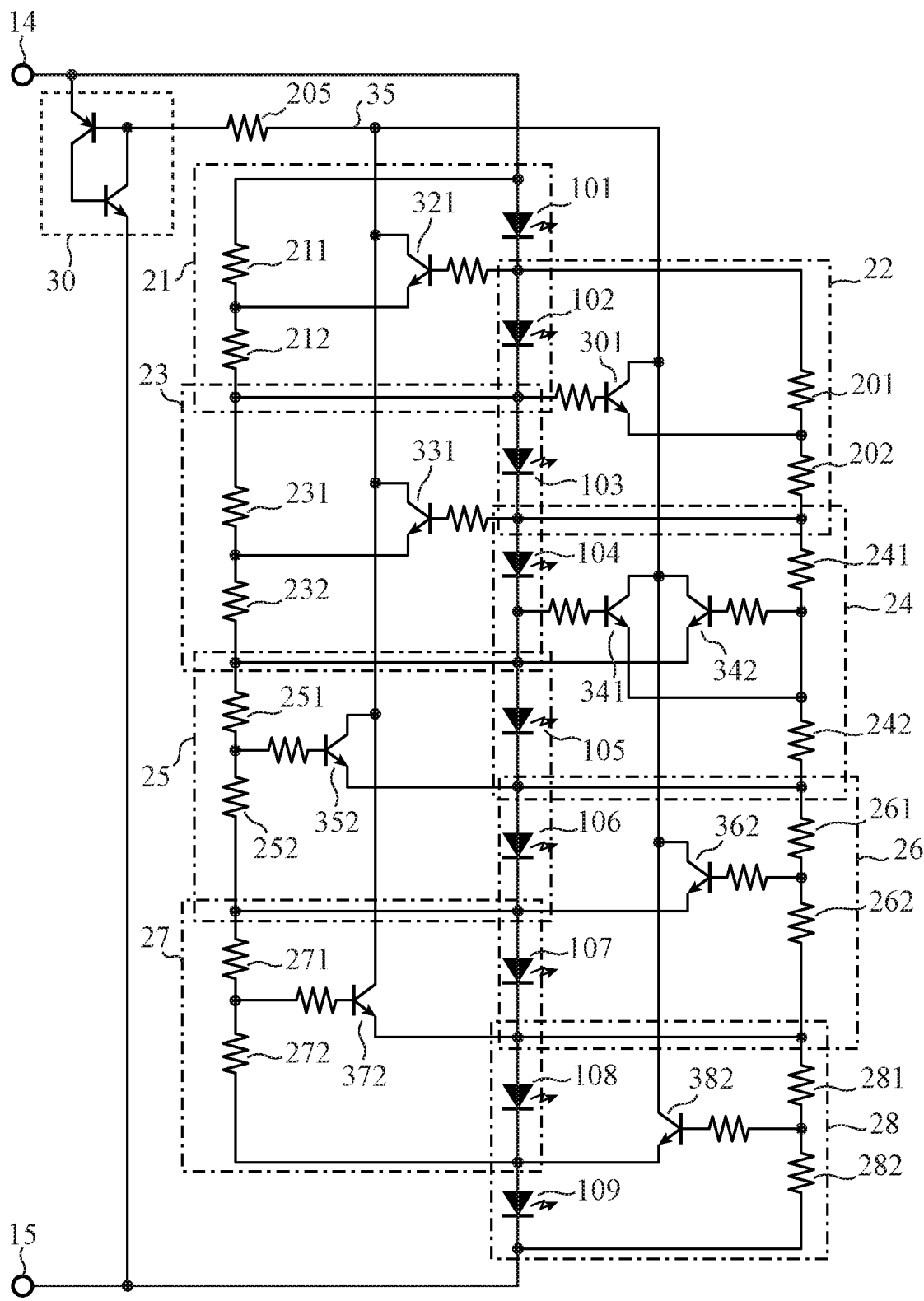
FIG. 17 is a diagram showing exemplary configurations of a plurality of bridge circuits of the third embodiment.

FIG. 17 is a diagram showing exemplary configurations of a plurality of bridge circuits 21 to 28 of the third embodiment. The bridge circuit 21 includes the LEDs 101 and 102 connected in series; and comparison resistors 211 and 212 connected in series. In addition, the bridge circuit 21 includes the transistor 321 for detecting a short-circuit failure of the LED 101. A short-circuit failure of the LED 102 is detected by the transistor 301 in the bridge circuit 22.

The bridge circuit 22 includes the LEDs 102 and 103 connected in series; and the comparison resistors 201 and 202 connected in series. In addition, the bridge circuit 22 includes the transistor 301 for detecting a short-circuit failure of the LED 102.

The bridge circuit 23 includes the LEDs 103 and 104 connected in series; and the comparison resistors 231 and 232 connected in series. In addition, the bridge circuit 23 includes the transistor 331 for detecting a short-circuit failure of the LED 103. A short-circuit failure of the LED 104 is detected by a transistor 341 in the bridge circuit 24.

The bridge circuit 24 includes the LEDs 104 and 105 connected in series; and comparison resistors 241 and 242 connected in series. In addition, the bridge circuit 24 includes the transistor 341 for detecting a short-circuit failure of the LED 104; and a transistor 342 for detecting a short-circuit failure of the LED 105.

The bridge circuit 25 includes the LEDs 105 and 106 connected in series; and comparison resistors 251 and 252 connected in series. In addition, the bridge circuit 25 includes a transistor 351 for detecting a short-circuit failure of the LED 106.

The bridge circuit 26 includes the LEDs 106 and 107 connected in series; and comparison resistors 261 and 262 connected in series. In addition, the bridge circuit 26 includes a transistor 361 for detecting a short-circuit failure of the LED 107.

The bridge circuit 27 includes the LEDs 107 and 108 connected in series; and comparison resistors 271 and 272 connected in series. In addition, the bridge circuit 27 includes a transistor 371 for detecting a short-circuit failure of the LED 108.

The bridge circuit 28 includes the LEDs 108 and 109 connected in series; and comparison resistors 281 and 282 connected in series. In addition, the bridge circuit 28 includes a transistor 381 for detecting a short-circuit failure of the LED 109.

In addition, collectors of the respective transistors 301, 321, 331, 341, 342, 352, 362, 372, and 382 are connected to the short-circuit informing signal line 35.

As described above, the light source unit 20 of the third embodiment includes the plurality of bridge circuits 21 to 28. By this configuration, the number of LEDs included in a single bridge circuit is reduced, and thus, the degree of detection accuracy of a short-circuit failure increases.

In addition, in the light source unit 20 of the third embodiment, the collectors of the plurality of transistors 301, 321, 331, 341, 342, 352, 362, 372, and 382 included in the plurality of bridge circuits 21 to 28, respectively, are connected to each other. By this, the single integrated short-circuit informing signal line 35 from the light source unit 20 to the power supply unit 10 can be implemented. In addition, the light-source-side power supply terminals 14 and 15 and wiring lines that connect the power supply unit 10 to the light source unit 20 can be formed into a single system, so that the configuration can be simplified.

Fourth Embodiment

In a fourth embodiment, a configuration in which a bridge circuit and a condition switching unit are provided on each of a plurality of substrates on which a plurality of LEDs are divided into respective groups and mounted is shown.

Figure 18:
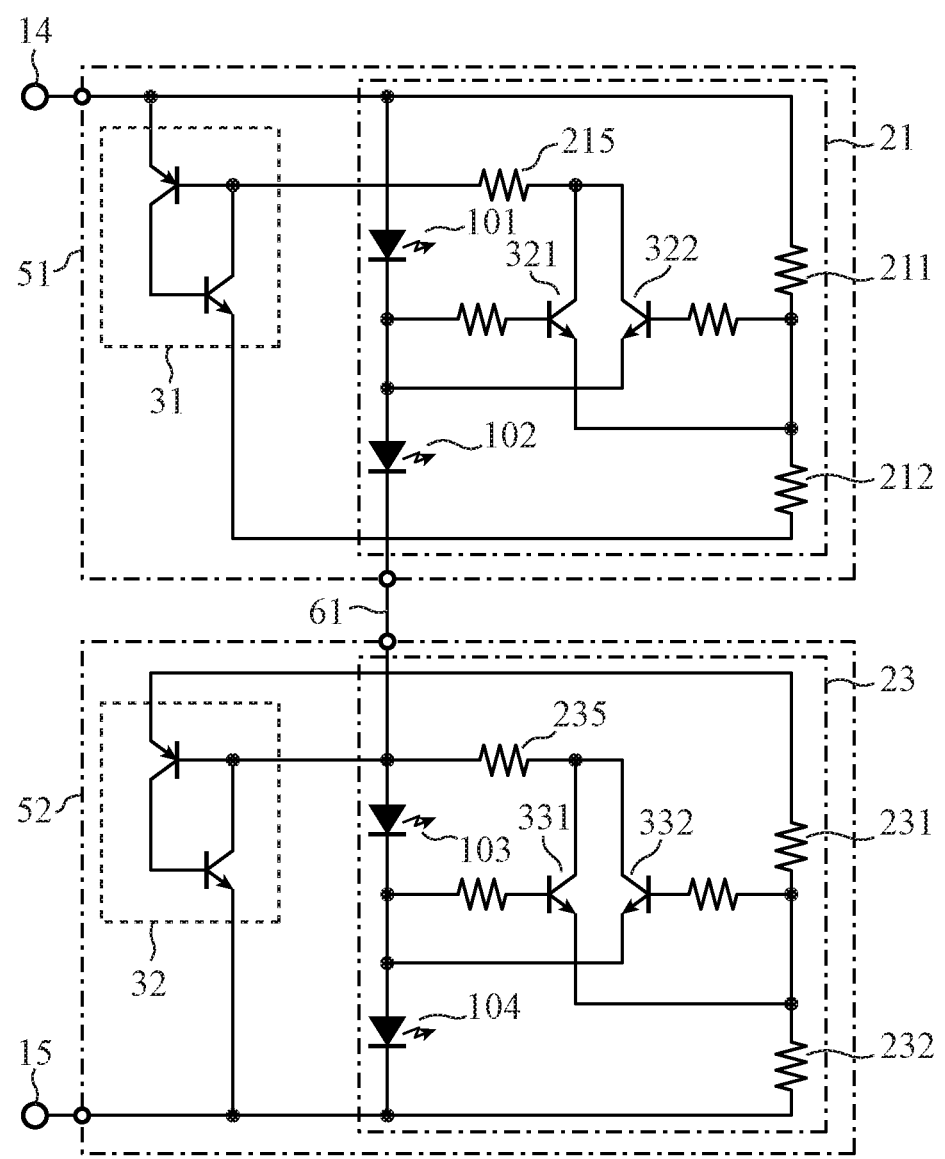
FIG. 18 is a diagram showing exemplary configurations of a plurality of bridge circuits of a fourth embodiment.
Figure 19:
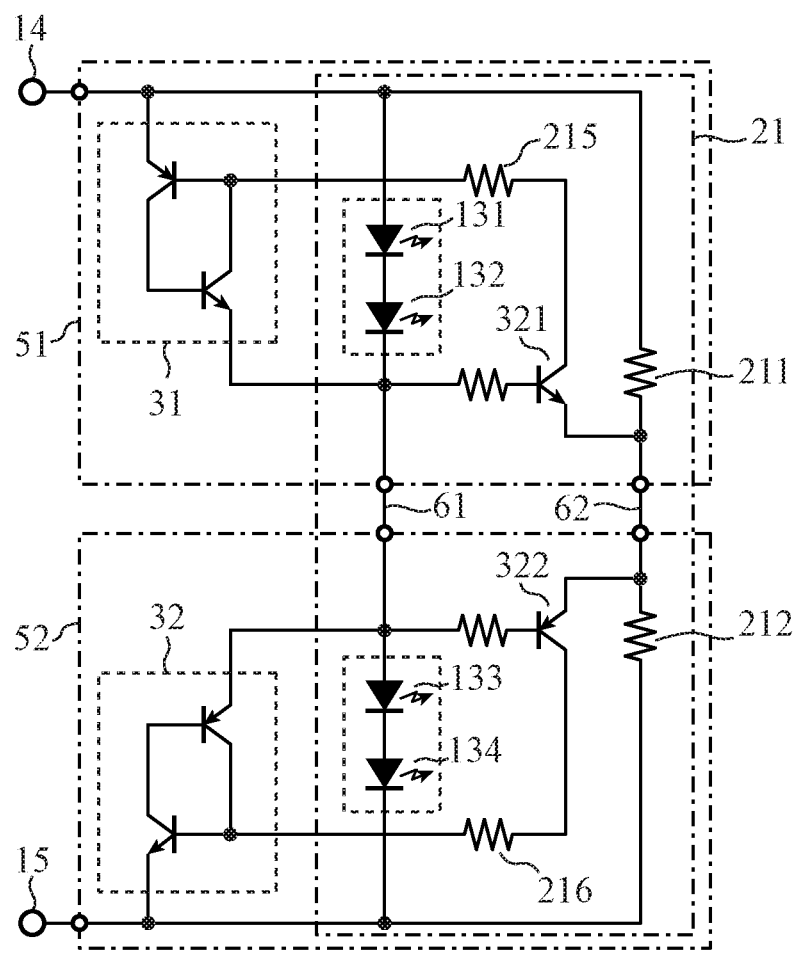
FIG. 19 is a diagram showing an exemplary configuration of a bridge circuit of the fourth embodiment.
Figure 20:
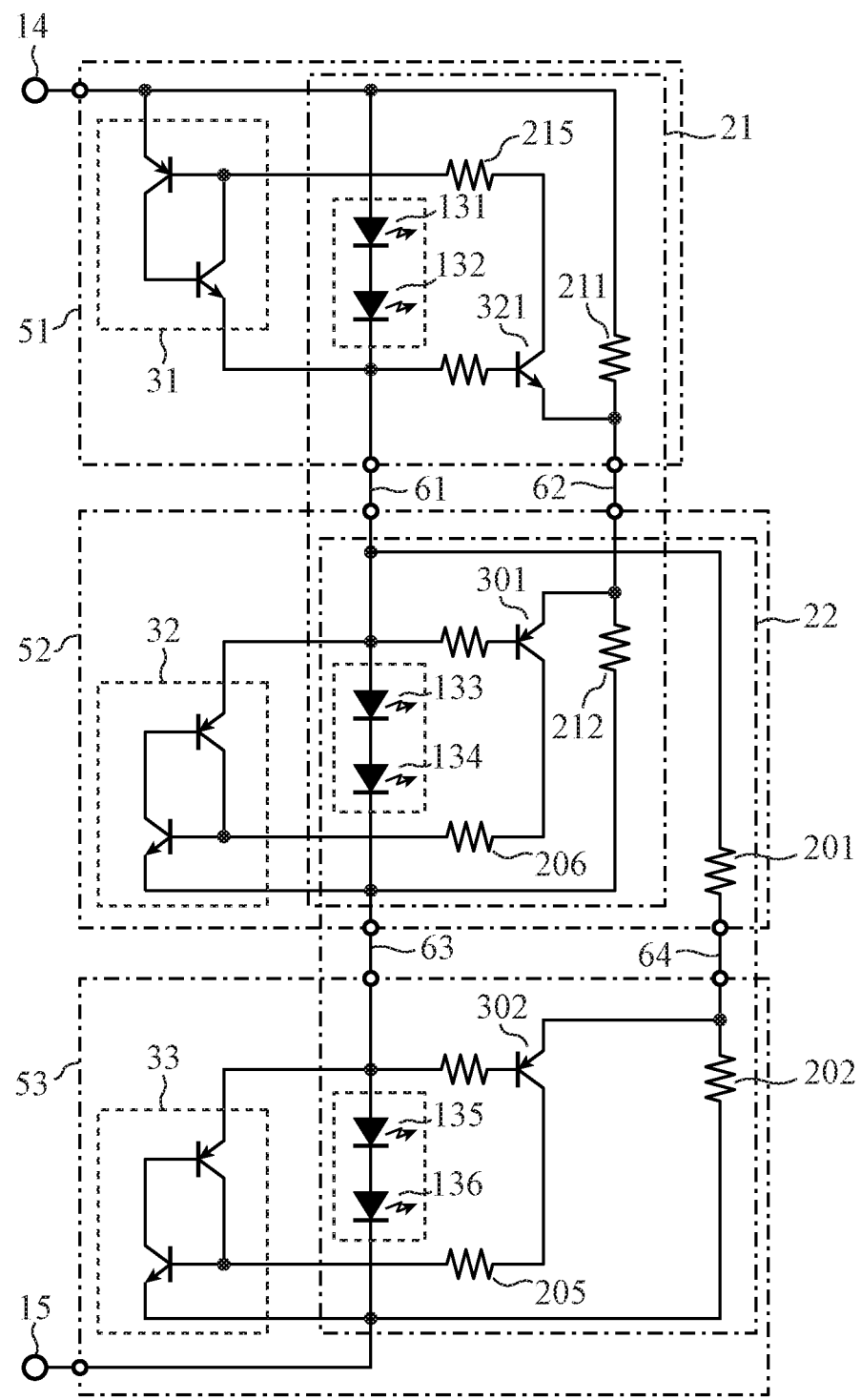
FIG. 20 is a diagram showing exemplary configurations of a plurality of bridge circuits of the fourth embodiment.

FIG. 18 is a diagram showing an exemplary configuration having the plurality of bridge circuits 21 and 23 in the fourth embodiment. In FIG. 18, and FIGS. 19 and 20 which will be described later, the same or corresponding portions as/to those of FIGS. 1 to 17 are denoted by the same reference signs and a description thereof is omitted.

As shown in FIG. 18, of the plurality of LEDs 101 to 104 included in the light source unit 20, the LEDs 101 and 102 are mounted on a first substrate 51, and the LEDs 103 and 104 are mounted on a second substrate 52. The first substrate 51 includes a condition switching unit 31 and the bridge circuit 21, and the bridge circuit 21 includes the LEDs 101 and 102 connected in series; the comparison resistors 211 and 212 connected in series; and the transistors 321 and 322 for detecting a short-circuit failure of the LEDs 101 and 102. The second substrate 52 includes a condition switching unit 32 and the bridge circuit 23, and the bridge circuit 23 includes the LEDs 103 and 104 connected in series; the comparison resistors 231 and 232 connected in series; and the transistors 331 and 332 for detecting a short-circuit failure of the LEDs 103 and 104. The LED 102 on the first substrate 51 is connected to the LED 103 on the second substrate 52 via a crossover line 61. As described above, in the exemplary configuration shown in FIG. 18, a complete configuration including LEDs, comparison resistors, and a condition switching unit is formed within each of the first substrate 51 and the second substrate 52.

FIG. 19 is a diagram showing an exemplary configuration having the bridge circuit 21 of the fourth embodiment. The LEDs 131 and 132 mounted on the first substrate 51 are implemented by an LED module, and the LEDs 133 and 134 mounted on the second substrate 52 are also implemented by an LED module. In the exemplary configuration of FIG. 19, the LEDs 131 and 132 which are the first light-emitting element group, a corresponding comparison resistor 221, the transistor 321 that detects a short-circuit failure of the LEDs 131 and 132, and the condition switching unit 31 that switches a load condition on the basis of the operation of the transistor 321 which are included in the bridge circuit 21 are disposed on a first substrate 51 side. In addition, the LEDs 133 and 134 which are the second light-emitting element group, the corresponding comparison resistor 212, the transistor 322 that detects a short-circuit failure of the LEDs 133 and 134, and the condition switching unit 32 that switches a load condition on the basis of the operation of the transistor 322 are disposed on a second substrate 52 side. The LED 132 on the first substrate 51 is connected to the LED 133 on the second substrate 52 via the crossover line 61. The comparison resistor 211 on the first substrate 51 is connected to the comparison resistor 212 on the second substrate 52 via a crossover line 62. As described above, in the exemplary configuration shown in FIG. 19, the pair of comparison resistors 211 and 212 are provided across the first substrate 51 and the second substrate 52, and the first light-emitting element group and the second light-emitting element group are separately disposed on the first substrate 51 and the second substrate 52, respectively.

FIG. 20 is a diagram showing an exemplary configuration having the plurality of bridge circuits 21 and 22 of the fourth embodiment. The LEDs 133 and 134, which are implemented by an LED module and the second light-emitting element group of the bridge circuit 21, are also used as the first light-emitting element group of the bridge circuit 22. In addition, the comparison resistor 211 in the bridge circuit 21 is disposed on the first substrate 51, the comparison resistor 212 in the bridge circuit 21 and the comparison resistor 201 in the bridge circuit 22 are disposed on the second substrate 52, and the comparison resistor 202 in the bridge circuit 22 is disposed on a third substrate 53. The LED 132 is connected to the LED 133 via the crossover line 61, and the LED 134 is connected to the LED 135 via a crossover line 63. The comparison resistor 211 is connected to the comparison resistor 212 via the crossover line 62, and the comparison resistor 201 is connected to the comparison resistor 202 via a crossover line 64. As shown in the above, in the exemplary configuration shown in FIG. 20, a pair of comparison resistors are provided across two substrates, and a first light-emitting element group and a second light-emitting element group are separately disposed on the two substrates, respectively.

As described above, the light source unit 20 of the fourth embodiment includes a plurality of substrates on which a plurality of LEDs are disposed to be divided into respective groups and mounted. Each of the plurality of substrates includes at least a part of a bridge circuit, and at least one of the substrates includes a condition switching unit. By this, when the plurality of LEDs in the light source unit 20 are disposed at a plurality of locations in a vehicle lamp fitting, a short-circuit failure of these LEDs can be detected.

Note that the vehicle lighting devices 1 according to the first to fourth embodiments are used for, for example, headlights, brake lights, or turn signal lights. The headlights are means for securing vision seen by a driver from his/her vehicle at night. The brake lights and the turn signal lights are means for showing an intention of a driver who drives his/her vehicle to vehicles, pedestrians, and the like, around his/her vehicle. Hence, to secure safety when the driver drives a vehicle, there is a need to promptly notify the driver of an abnormality occurring in a headlight, a brake light, and a turn signal light, and immediately deal with the abnormality, such as repairs. The vehicle lighting devices 1 according to the first to fourth embodiments can detect a short-circuit failure of one or more LEDs among a plurality of LEDs included in the light source unit 20, and thus, can promptly detect occurrence of an abnormality in the light source unit 20.

In the present invention, a free combination of the embodiments, modifications to any component of the embodiments, or omissions of any component in the embodiments are possible within the scope of the invention.

INDUSTRIAL APPLICABILITY

Vehicle lighting devices according to the invention are configured to detect a short-circuit failure of a plurality of light-emitting elements connected in series, and thus, are suitable for use in headlights, brake lights, turn signal lights, and the like.

REFERENCE SIGNS LIST

1: Vehicle lighting device, 2: Power supply, 10: Power supply unit, 11: Turn-on controlling unit, 12: Detection resistor, 13: Voltage/current controlling unit, 14 and 15: Light-source-side power supply terminal, 16: Signal terminal, 20: Light source unit, 21 to 28: Bridge circuit, 30 to 33: Condition switching unit, 35: Short-circuit informing signal line, 36 and 40: Logic unit, 37, 41, and 42: Switching element, 38: Diode, 39: Capacitor, 43: Current limiting resistor, 44: Condition holding resistor, 45: Resistor for stabilizing a FET gate voltage, 208: VBE adjusting resistor, 51: First substrate, 52: Second substrate, 53: Third substrate, 64 to 64: Crossover line, 101 to 109 and 131 to 136: LED, 110: First light-emitting element group, 120: Second light-emitting element group, 201, 202, 211, 212, 231, 232, 241, 242, 251, 252, 261, 262, 271, 272, 281, and 282: Comparison resistor, 203 to 205, 213, 215, 216, 234, and 235: Base resistor, and 301, 302, 311, 312, 321, 322, 331, 332, 341, 342, 351, 362, 372, and 382: Transistor.

The invention claimed is:
1. A vehicle lighting device comprising:
a light source unit including a plurality of light-emitting elements connected in series; and
a power supply unit to turn on the plurality of light-emitting elements, wherein
in the light source unit, the plurality of light-emitting elements connected in series are divided into a first light-emitting element group which constitutes a high potential side group and a second light-emitting element group which constitutes a low potential side group which are connected at a first connecting point, the light source unit further including, a pair of comparison resistors connected in series to generate a voltage equivalent to a voltage at the first connecting point between the first light-emitting element group and the second light-emitting element group when all light-emitting elements are operating, one of the comparison resistors being connected between a high potential side of the first light-emitting element group and a second connecting point and another of the comparison resistors being connected between the second connecting point and a low potential side of the second light-emitting element group; and a transistor having a base connected to one of the first and second connecting points and having an emitter connected to the other of said first and second connecting points, the first light-emitting element group, the second light-emitting element group, and the pair of comparison resistors form at least one bridge circuit;

wherein, when one or more light-emitting elements included in the first light-emitting element group or the second light-emitting element group are short-circuited, the transistor operates.

2. The vehicle lighting device according to claim 1, wherein the plurality of light-emitting elements connected in series are divided into three or more light-emitting element groups to form the at least one bridge circuit to include a plurality of bridge circuits.

3. The vehicle lighting device according to claim 2, wherein a first light-emitting element group or a second light-emitting element group included in one of the plurality of bridge circuits is also used as a first light-emitting element group or a second light-emitting element group included in another bridge circuit among the plurality of bridge circuits.

4. The vehicle lighting device according to claim 2, wherein collectors of a plurality of transistors respectively included in the plurality of bridge circuits are connected to each other.

5. The vehicle lighting device according to claim 1, wherein a voltage that drops when one light-emitting element included in the first light-emitting element group or the second light-emitting element group is turned on is twice or more a base-emitter voltage generated when the transistor operates.

6. The vehicle lighting device according to claim 1, further comprising a condition switching unit to switch a load condition of the light source unit with respect to the power supply unit when the transistor operates.

7. The vehicle lighting device according to claim 6, wherein the condition switching unit places both ends of the light source unit in a short-circuit condition when the transistor operates, the both ends being connected to the power supply unit.

8. The vehicle lighting device according to claim 6, wherein the condition switching unit cuts off the light source unit from the power supply unit when the transistor operates.

9. The vehicle lighting device according to claim 6, wherein the condition switching unit repeatedly performs switching, when the transistor operates, between a condition in which both ends of the light source unit are short-circuited and a normal condition, the both ends being connected to the power supply unit.

10. The vehicle lighting device according to claim 6, wherein the condition switching unit repeatedly performs switching, when the transistor operates, between a condition in which the light source unit is cut off from the power supply unit and a normal condition.

11. The vehicle lighting device according to claim 1, wherein the light source unit includes a plurality of substrates on which the plurality of light-emitting elements are divided into respective groups and mounted, and a light-emitting element mounted on each of the plurality of substrates forms at least a part of the at least one bridge circuit.

12. The vehicle lighting device according to claim 11, wherein at least one of the plurality of substrates on which the plurality of light-emitting elements are divided into the respective groups and mounted includes a condition switching unit to switch a load condition of the light source unit with respect to the power supply unit.

13. The vehicle lighting device according to claim 1, wherein the light source unit is a light source of a headlight, a brake light, or a turn signal light.

* * * * *